United States Patent [19]
Bernstein

[11] Patent Number: 5,585,602
[45] Date of Patent: Dec. 17, 1996

[54] STRUCTURE FOR PROVIDING CONDUCTIVE PATHS

[75] Inventor: Joseph B. Bernstein, Newton, Mass.

[73] Assignee: Massachusetts Institute of Technology, Cambridge, Mass.

[21] Appl. No.: 370,004

[22] Filed: Jan. 9, 1995

[51] Int. Cl.⁶ ........................................ H05K 1/14
[52] U.S. Cl. .......................... 174/262; 174/261; 174/250; 439/44; 439/74; 361/805; 29/846; 29/847; 29/852; 29/853
[58] Field of Search ................................. 174/250, 261, 174/262; 439/47, 48, 44, 65, 74; 361/805, 745; 29/846, 847, 852, 853

[56] References Cited

U.S. PATENT DOCUMENTS

| | | | |
|---|---|---|---|
| 4,240,094 | 12/1980 | Mader | 357/45 |
| 4,455,495 | 6/1984 | Masuhara et al. | 307/44 |
| 4,631,100 | 12/1986 | Pellegrino | 156/150 |
| 4,636,404 | 1/1987 | Raffel et al. | 427/53.1 |
| 4,665,295 | 5/1987 | McDavid | 219/121 |
| 4,667,404 | 5/1987 | Reisman et al. | 29/847 |
| 4,700,214 | 10/1987 | Johnson | 357/68 |
| 4,701,860 | 10/1987 | Mader | 364/490 |
| 4,720,470 | 1/1988 | Johnson | 437/173 |
| 4,751,197 | 6/1988 | Wills | 437/174 |
| 4,810,663 | 3/1989 | Raffel et al. | 437/46 |
| 4,888,665 | 12/1989 | Smith | 361/400 |
| 4,893,167 | 1/1990 | Boudou et al. | 357/51 |
| 4,916,809 | 4/1990 | Boudou et al. | 29/852 |
| 4,937,475 | 6/1990 | Rhodes et al. | 307/465 |
| 5,087,589 | 2/1992 | Chapman et al. | 437/195 |
| 5,165,166 | 11/1992 | Carey | 29/847 |
| 5,166,547 | 11/1992 | Babakanian et al. | 307/303.2 |
| 5,166,556 | 11/1992 | Hsu et al. | 307/465 |

FOREIGN PATENT DOCUMENTS 0256494  2/1988  European Pat. Off. .

OTHER PUBLICATIONS

Hartman, H. D., "Yield and Reliability of Laser Formed Verticak Links," 146/SPIE, vol. 2090 Multilevel Interconnection, 1993, pp. 146–160.
Lee, Rex A., et al., "Laser Programmable Interconnects for the Quick Turn Around of Electronic Systems," 4.6/Lee/Laser–Programmable Interconnects, Nov. 1983, pp. 81–84.
M. Burnus et al., "Laserpersonalization of Interconnection Arrays For Hybride ACIS's," 0–7803–0867–0/93, IEEE, 1993, pp. 329–338.
Rouillon–Martin, Martine, et al., "Laser Programmable Vias for Reconfiguration of Integrated Circuits," 190/SPIE, vol. 1138 Optical Microlithography and Metrology for Microcircuit Fabrication, 1989, pp. 190–197.
Liu et al., "Area–Selective Laser Processing Techniques for Multichip Interconnect, Y.S.," Mat. Res. Soc. Symp. Proc., vol. 154. Materials Research Society, 1989, pp. 11–20.
Dong Sam Ha & Vijay P. Kumar, "On the Design of High–Yield Reconfigurable PLA's", 0018–9340/90/0400–0470, IEEE, 1990, pp. 470–479.
Bernstein, Joseph B. et al., "High Density Metal Cross–Point Laser Linking," 0–8186–2482–5/92, IEEE, 1992, pp. 176–181.
Y. Morishige et al., "High Performance Contact Formation in LSI Circuit Restructuring Using Visible Pulse Laset Induced Ablation and CVD," 0169–4332/90, Elsevier Science Publishers B.V. (North Holland), 1990, pp. 108–112.

Primary Examiner—Laura Thomas
Attorney, Agent, or Firm—Hamilton, Brook, Smith & Reynolds, P.C.

[57] ABSTRACT

A method for forming one or more conductive paths by providing a first pattern of pre-formed conductive elements and a second pattern of preformed conductive elements in a substrate and forming, at a single level, one or more lateral conductive links between selected ones of the first and second conductive elements to provide a selected configuration of one or more conductive paths.

9 Claims, 3 Drawing Sheets

STRUCTURE FOR PROVIDING CONDUCTIVE PATHS

INTRODUCTION

This invention relates generally to the formation of one or more conductive paths in a substrate to provide integrated circuitry, for example, and, more particularly, to the formation thereof using different patterns of conductive elements and providing conductive links between selected ones of the conductive elements in such patterns.

BACKGROUND OF THE INVENTION

In making integrated circuit (IC) devices, for example, it is desirable to be able to provide a plurality of conductive paths using different patterns of conductive elements which are positioned at one level and, in some cases, more than one level of a dielectric substrate. In some cases, the conductive elements are pre-arranged in the substrate to provide a plurality of pre-formed conductive paths which are then useable to provide desired conductive paths in the IC device by making appropriately selected cuts only in the already pre-formed conductive paths at selected points thereof. In some cases the conductive elements are often provided at two different levels, for example, so that in addition to such cuts vertical links must be pre-formed between conductive elements which are positioned at such two different levels.

For example, U.S. Pat. No. 4,700,214, issued on Oct. 13, 1987 to M. Johnson and U.S. Pat. No. 4,720,470, issued on Jan. 19, 1988 to M. Johnson, both disclose the use of an array of conductive pathways which are interconnected by pre-formed links. Selective conductive pathways are provided only by making appropriate cuts in the preformed conductive pathways as by using a pulsed laser to sever unaligned portions thereof as appropriate to create desired electrical circuitry.

U.S. Pat. No. 4,810,663, issued on Mar. 7, 1989 to J. I. Raffel, et al. discloses the use of conductive layers at two different levels with an insulating or dielectric layer between the two levels. Diffusion barriers are employed between the insulating layer and each of the conductive layers. Exposure of a link point to a relatively long width pulse of low power laser energy produces a vertical conductive link extending between conductive elements at each layer, the laser energy converting the dielectric material into a conductive path at the vertical link site.

U.S. Pat. No. 5,087,589 issued on Feb. 11, 1992 to Chapman et al. discloses the use of an ion implantation technique for producing conductive links between conductive elements.

IBM Technical Disclosure Bulletin, Vol. 17, No. 1 of Jun. 1994 by P. W. Cook et al. discloses the use of aluminum metallization highways which are joined to underlying interconnection tracks which are diffused into the surface of a substrate.

U.S. Pat. No. 4,937,475, issued on Jun. 26, 1990 to Rhodes, and U.S. Pat. No. 4,240,094, issued on Dec. 16, 1980 to Mader, disclose the provision of links between conductive elements at two different levels, which link is provided at still a third level using a diffusion technique to link the conductive elements at the two other levels.

U.S. Pat. No. 4,701,860, issued on Oct. 20, 1987 to Mader discloses programmable architecture for laying out circuitry but does not disclose specific techniques for forming links between metal elements.

While the above approaches discuss the formation of conductive paths so as to provide useable IC circuits, the density of the paths and the reliability thereof is not as high as may be desired in many applications. There is a need, for example, to make such IC devices as small as possible by providing as high a density of conductive paths for forming circuitry therein as can be achieved. Moreover, it is desirable to do so while providing high yields for such devices, i.e., the formation of the desired configurations of conductive paths must be highly reliable so that fewer devices are subject to rejection in the production thereof.

BRIEF SUMMARY OF THE INVENTION

In accordance with the invention, a first pattern of first pre-formed conductive elements and a second pattern of second conductive elements are provided on a substrate and lateral conductive links are formed at a single level between selected ones of the first and second conductive elements so as to provide a plurality of desired conductive paths. As used herein, the term "level" is intended to include embodiments wherein the surfaces of the elements involved lie at substantially the same level, whether or not the elements themselves are formed or deposited on the same planar surface. In one embodiment thereof, for example, a first pattern of conductive elements is formed at a first level while a second pattern of second conductive elements is such that it has portions of its conductive elements at two levels, i.e., first portions thereof being at the same level as the first conductive elements and other portions thereof being at another second level below the first level. Lateral conductive links are then formed at a single level between selected ones of the first conductive elements and selected ones of the portions of the second conductive elements that are at the same level. In another embodiment, for example, the first and second patterns of conductive elements are all formed at the same level and lateral links are formed at such level. In addition, appropriate cuts can also be made to separate, as necessary, the conductive paths that are so formed.

DESCRIPTION OF THE INVENTION

The invention can be more described more specifically with the help of the accompanying drawings wherein FIG. 1 depicts patterns of exemplary conductive elements in which links and cuts can be provided to form desired conductive paths;

Figure 1:
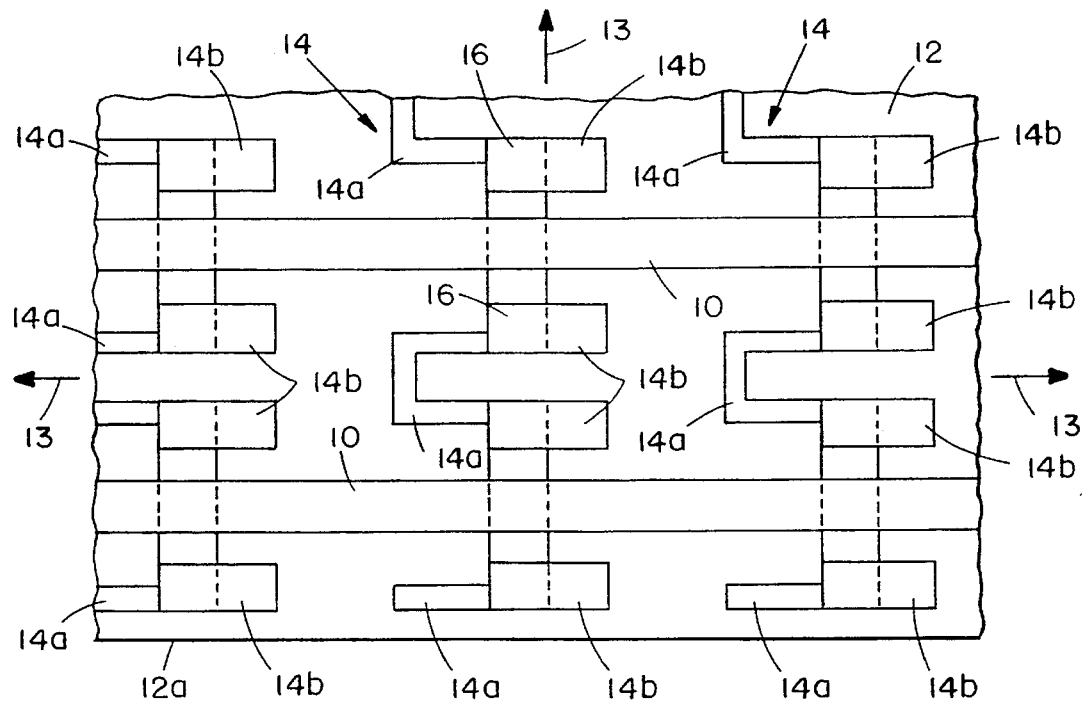
Figure 2:
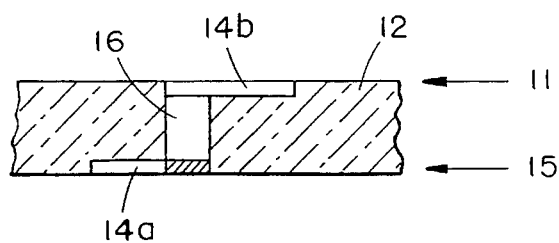
FIG. 2 depicts in vertical section a portion of the pattern of FIG. 1.

FIGS. 1 and 2 depict an embodiment of the invention wherein a first pattern of first conductive elements 10 of the first pattern is formed at a first level 11 of a dielectric substrate 12. Two such conductive elements 10 are shown in FIG. 1 as extending along the same direction, i.e., they are essentially parallel to each other. It is clear that FIG. 1 shows only a representative portion of an overall array of such a pattern, the representative portion being along one edge 12A of the substrate, for example, while the overall array extends well beyond that shown in the figure in the directions shown by arrows 13. In the particular embodiment depicted, a second pattern of second conductive elements 14 extends in a direction generally orthogonal to the direction of first conductive elements 10, portions 14A of each of which lie at a second level 15 below that of the first level 11. Portions 14B of the second conductive elements 14 lie at the same level 11 as the first conductive elements 10, portions 14A and the portions 14B being interconnected by pre-formed vertical vias 16 at appropriate sides extending between levels 11 and 15 (FIG. 2). The second conductive elements 14 are, in the particular embodiment depicted, formed in a generally zig-zag configuration at second level 15 in order to provide for a relatively high density of elements and to permit "cuts" in the conductive elements to be made more readily, as discussed below. Portions 14B, in the embodiment depicted, effectively provide conductive portions, or tabs, at the first level 11 which are effectively parallel to portions of conductive elements 10 that are adjacent thereto.

Using the particular configuration depicted in the embodiment of FIGS. 1 and 2, for example, a plurality of conductive paths can be formed as desired by making suitable lateral conductive links at the same level 11 between selected ones of the conductive elements and, if necessary, by making appropriate cuts at selected regions of selected ones of the conductive elements.

Figure 3:
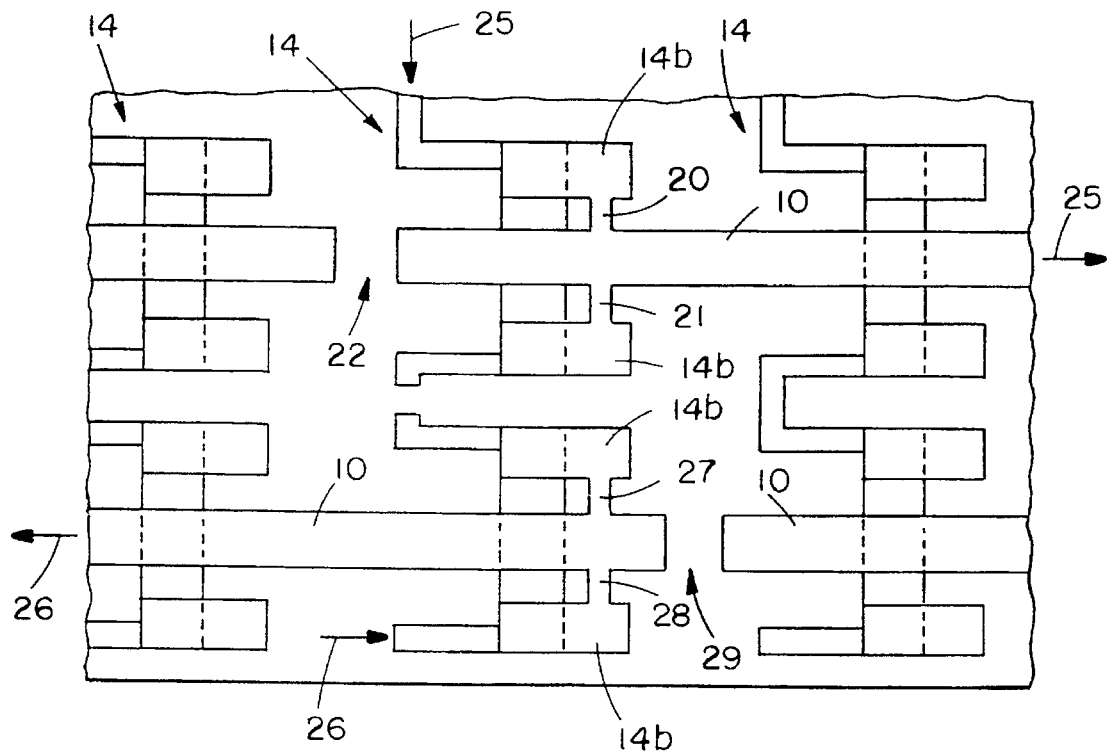
FIG. 3 depicts exemplary conductive paths that are formed in the patterns of FIG. 1 using the technique of the invention.

One exemplary embodiment of the formation of a conductive path is illustrated in FIG. 3, wherein lateral links 20 and 21 are formed between a first conductive element 10 and adjacent tab portions 14B of a second conductive element 14 so that a conductive path shown by the shaded regions in the figure is formed between the points thereof depicted by arrows 25. One particular preferred technique for forming such lateral links is described in my U.S. patent application, Ser. No. 08/209,997, filed on Mar. 10, 1994, which is incorporated herein by reference and discloses an effective method therefor by using pulsed laser energy to cause flow of metal between conductive elements at link sites. While such approach is preferred, other techniques may be devised and used by those art for such purposes. In addition, a cut is made at region 22 of the adjacent first conductive element 10 to isolate such path from other conductive paths that may be formed. The use of the two lateral links 20 and 21 using tab portions 14B at the same level as conductive element 10, as shown, provides for redundancy in the conductive path so as to increase the current carrying capacity and the reliability of the path that has been formed. Alternatively, only a single element tab portion 14B may be made available and its associated tab portion as shown in FIG. 3 may be eliminated from the original pattern, in which case the conductive elements can be more densely positioned on the substrate. In such case, however, redundant links 20 and 21 cannot be formed so that, while an increased density can be achieved, it is attained at the expense of a possible decrease in reliability.

Another exemplary conductive path shown by the shaded regions between arrows 26 is also depicted in FIG. 3 wherein lateral links 27 and 28 are formed at the same level 11 between a first conductive element 10 and adjacent portions 14B of a second conductive element 14. An appropriate cut is made at region 29 of first conductive element 10 to isolate the conductive path from other conductive paths that may be formed.

The above described conductive paths are exemplary only and it would be clear to those in the art from such description as to how other appropriate links and cuts can be used to form a plurality of different conductive paths in an overall array of first and second patterns of conductive elements pre-formed in a substrate, only a part of which is illustrated in FIGS. 1–3.

Figure 4:
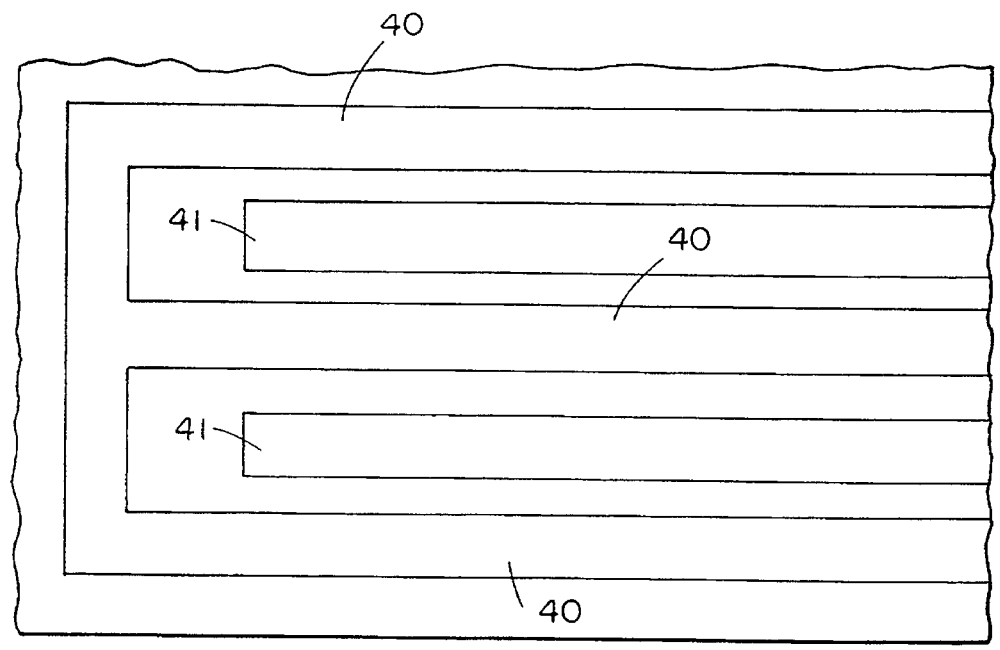
FIG. 4 depicts other patterns of exemplary conductive elements in which links and cuts can be provided to form desired conductive paths.
Figure 5:
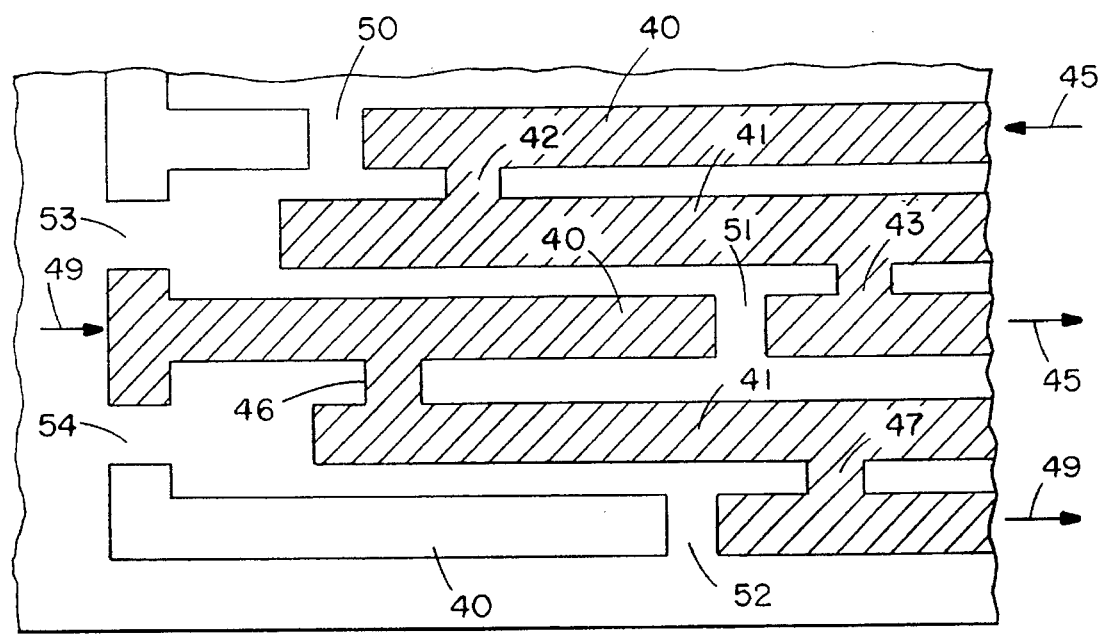
FIG. 5 depicts exemplary conductive paths that are formed in the patterns of FIG. 4 using the technique of the invention.

A further embodiment of the invention is depicted in FIG. 4 wherein the first and second patterns of conductive elements involved lie at the same level in a substrate. Thus, a first pattern of first conductive elements 40 are positioned to lie generally in the same direction and a second pattern of second conductive elements 41 are positioned at the same level to lie in the same general direction so that the conductive elements of each pattern are arranged in an interdigital manner, as shown. Appropriate lateral links between selected ones of the conductive element 40 and 41 can be formed at the same level so as to form a plurality of conductive paths as desired, suitable cuts being also made to isolate the paths from each other. For example, as shown in FIG. 5, appropriate links 42 and 43 are formed at the same level to provide a conductive path shown by the shaded regions between arrows 45, while appropriate links 46 and 47 are formed at the same level to provide a conductive path shown by the shaded region between arrows 49. Suitable cuts as shown at regions 50, 51, 52, 53, and 54 are also provided to isolate such paths from each other. It is clear that FIGS. 4 and 5 depict only a part of an overall array of patterns of conductive elements 40 and 41 and it would be clear to the art from the above description that a number of conductive paths could be formed in such an overall array using appropriate lateral links at the same level, as well as suitable cuts as required to isolate the paths from each other.

While the embodiments described above represent exemplary embodiments of the invention, other embodiments thereof will occur to those in the art within the spirit and scope of the invention. Hence, the invention is not to be construed as limited to the particular exemplary embodiments disclosed, except as defined by the appended claims.

What is claimed is:

1. A method for forming conductive paths comprising providing a first pattern of first conductive elements pre-formed at a first level of a substrate;

providing a second pattern of second conductive elements pre-formed on said substrate, wherein first portions of said second conductive elements are at a second level of said substrate and second portions of said second conductive elements are at said first level, said first and second portions being interconnected by pre-formed vertical conductive vias;

forming, at said first level, at least one lateral conductive link between selected first and second conductive elements so as to provide a selected configuration of conductive paths; and forming cuts in selected ones of said first and second conductive elements to separate conductive paths of said selected configuration.

2. A method in accordance with claim 1 wherein said lateral conductive links are formed using laser energy.

3. A device having conductive paths comprising:

a first pattern of first conductive elements pre-formed at a first level of a substrate;

a second pattern of second conductive elements pre-formed on said substrate, first portions of said second conductive elements being at a second level of said substrate and second portions of said second conductive elements being at said first level, said first and second portions being interconnected by pre-formed vertical conductive vias;

at least one lateral conductive link formed, at said first level, between selected first and second conductive elements, said conductive links providing a selected configuration of conductive paths; and at least one cut formed in selected ones of said first and second conductive elements to separate the conductive paths of said selected configuration.

4. A device in accordance with claim 3 and further including a laser energy source for supplying laser energy to form such lateral conductive links.

5. A method of programmably forming conductive paths comprising:

providing a substrate having a circuit thereon, the circuit comprising patterns of conductive elements preformed at a common level of a substrate, the patterns including adjacent conductive elements in said common level at programmable link sites;

programming the circuit by selectively forming links and cutting conductive elements in said common level,
the step of forming links comprising applying energy to link sites to cause conductive material of a conductive element to flow laterally to an adjacent conductive element, and the step of cutting comprises applying energy to provide breaks in conductive elements.

6. A method as claimed in claim 5 wherein the energy is applied from a laser to form the lateral conductive links and to cut the conductive elements.

7. A method as claimed in claim 5 wherein the programmable circuit further comprises conductive elements at a second level of the substrate which are interconnected with conductive elements of the first level of the substrate.

8. A device having programmed conductive paths comprising:

a circuit comprising conductive elements at a first level of a substrate, the conductive elements at the first level of the substrate including adjacent conductive elements at link sites;

at least one lateral conductive link formed in the first level, of conductive element material which has been caused to flow from conductive elements at programmable link sites; and cuts formed in selected ones of the conductive elements in the first level providing breaks in the conductive elements.

9. A device as claimed in claim 8 further comprising conductive elements at a second level electrically connected to conductive elements at the first level.

* * * * *

UNITED STATES PATENT AND TRADEMARK OFFICE
CERTIFICATE OF CORRECTION

PATENT NO. : 5,585,602

DATED : December 17, 1996

INVENTOR(S) : Joseph B. Bernstein

It is certified that error appears in the above-identified patent and that said Letters Patent is hereby corrected as shown below:

In the Specification at Column 1, line 4, before "INTRODUCTION" insert the following:

---GOVERNMENT SUPPORT

This invention was made with government support under contract number F19628-90-C-0002 awarded by the Department of the Air Force. The government has certain rights in the invention.---

Signed and Sealed this

Twenty-fifth Day of March, 1997

Attest:

BRUCE LEHMAN

Attesting Officer

Commissioner of Patents and Trademarks